US009385295B2

(12) United States Patent
Motowidlo

(10) Patent No.: US 9,385,295 B2
(45) Date of Patent: Jul. 5, 2016

(54) POWDER AND ROD PROCESS FOR FORMING SUPERCONDUCTING WIRE AND METHOD OF MANUFACTURE THEREOF

(75) Inventor: Leszek Motowidlo, Southington, CT (US)

(73) Assignee: SupraMagnetics, Inc., Plantsville, CT (US)

( * ) Notice: Subject to any disclaimer, the term of this patent is extended or adjusted under 35 U.S.C. 154(b) by 995 days.

(21) Appl. No.: 12/537,303

(22) Filed: Aug. 7, 2009

(65) Prior Publication Data

US 2010/0031494 A1 Feb. 11, 2010

Related U.S. Application Data

(60) Provisional application No. 61/087,249, filed on Aug. 8, 2008.

(51) Int. Cl.
*H01L 39/00* (2006.01)
*H01L 39/24* (2006.01)

(52) U.S. Cl.
CPC ........ *H01L 39/2409* (2013.01); *H01L 39/2403* (2013.01); *Y10T 29/49014* (2015.01)

(58) Field of Classification Search
CPC ............ H01L 39/2409; H01L 39/2406; H01L 39/2403; H01L 39/24; Y10T 29/49014
USPC ......................................... 29/599; 174/125.1
See application file for complete search history.

(56) References Cited

U.S. PATENT DOCUMENTS 4,161,062 A * 7/1979 Agatsuma et al. .............. 29/599
4,629,515 A * 12/1986 Imaizumi et al. ................ 419/3

OTHER PUBLICATIONS

C.A.M. Van Beijnen, et al. "Multifilament Nb3sn Superconductors Produced by the E.C.N. Technique", IEEE Transactions on Magnetics, vol. Mag-15, No. 1, Jan. 1979., pp. 87-90; in English.
Albertus Godeke, "Performance Boundaries in Nb3Sn Superconductors", Sep. 12, 1967., pp. Covers, 19-21; in English.
E. Gregory, "Concise Encyclopedia of Magnetic & Superconducting Materials", 1992, pp. Covers, 332-340; in English.
H. Krauth, et al. "Proceedings of International Workshop on Progress of Nb-Based Superconductors, Progress of Nb-Based Superconductors", Feb. 18, 2005., pp. Covers, 91-98; in English.

(Continued)

*Primary Examiner* — Livius R Cazan
(74) *Attorney, Agent, or Firm* — Katten Muchin Rosenman LLP

(57) ABSTRACT

A powder and rod process for forming $Nb_3Sn$ or $V_3Ga$ superconducting wire is provided. The process includes hot extrusion or cold drawing of an assembly comprising an octagonal or hexagonal configuration of copper-clad rods comprising niobium, vanadium, a niobium alloy, or a vanadium alloy and an intermetallic powder compound, such as $MnSn_2$, that is situated in a central hole within the octagonal or hexagonal configuration of rods.

14 Claims, 10 Drawing Sheets

(56) References Cited

OTHER PUBLICATIONS

L. R. Motowidlo, et al., "A NB3SN Conductor Via CU5SN4 Pit Process for High Field Applications", 2008, pp. 269-276; in English.
Jeffrey A. Parrell, et al., "High Field Nb3 Sn Conductor Development at Oxford Superconducting Technology", IEEE Transactions on Applied Superconductivity vol. 13. No. 2 Jun. 2003, pp. 3470-3473; in English.

Charles V. Renaud, et al., "Status of Powder-In-Tube Nb3Sn Conductor Development at Supercon", IEEE Transactions on Applied Superconductivity vol. 13. No. 2 Jun. 2003, pp. 3490-3493; in English.
Bruce A. Zeitlin, et al., "Results on Mono Element Internal Tin Nb3Sn Conductors (MEIT) with Nb7.5Ta and Nb(1Zr +OX) Filaments", IEEE Transactions on Applied Superconductivity Vol. 15. No. 2 Jun. 2005, pp. 3393-3398; in English.

* cited by examiner

POWDER AND ROD PROCESS FOR FORMING SUPERCONDUCTING WIRE AND METHOD OF MANUFACTURE THEREOF

CROSS-REFERENCE TO RELATED APPLICATIONS

This application claims priority benefit of U.S. Provisional Patent Application No. 61/087,249, filed Aug. 8, 2008, the contents of which are incorporated herein by reference in their entirety.

BACKGROUND OF THE INVENTION

1. Field of the Invention

The present invention relates to manufacturing of superconductor wire. More particularly, the invention relates to a method for manufacturing superconductor wire using a powder and rod process in conjunction with a multifilament niobium-tin design and a vanadium-gallium design that incorporates a plurality of niobium or niobium alloy or vanadium or vanadium filaments in a copper matrix.

2. Background

The conventional internal-tin process (IT) (see Eric Gregory, "Multifilamentary Superconducting Composites", Concise Encyclopedia of Magnetic and Superconducting Materials, p. 332, 1992, Editor Jan Evetts, Pergamon Press, the contents of which are incorporated herein by reference in their entirety) and the conventional powder-in-tube process (PIT) (see C. A. M. van Beijen and J. D. Elen, IEEE Trans. Magn., MAG-15, 87, 1979, the contents of which are incorporated herein by reference in their entirety; and J. H. Lindenhovius, "SMI Activities and Plans on PIT $Nb_3Sn$", WAMS, Archamps, Mar. 23, 2004, the contents of which are incorporated herein by reference in their entirety) are the leading $Nb_3Sn$ conductor manufacturing approaches that have the potential to meet the High Energy Physics (HEP) goals of performance and cost for high field magnets such as the LHC luminosity upgrade. Along with the standard bronze process, schematics of both approaches are compared in FIG. 1. The main advantage of both the IT and PIT approaches is that they have more tin available (up to 20%) for $Nb_3Sn$ formation, where as the bronze approach is limited to 13% by weight. See A. Godeke, "Performance Boundaries in $Nb_3Sn$ Superconductors", Ph.D. Thesis, 2005, University of Twente, Enshede, The Netherlands, the contents of which are incorporated herein by reference in their entirety.

Because of the higher availability of tin in both the IT and PIT approaches, significant progress has been achieved toward improving the non-Cu $J_c$ (critical current density, Amps/mm$^2$) performance. For example, the performance goal set by the conductor advisory group has been attained by the IT approach. See R. M. Scanlan and D. R. Dietderich, "Progress and Plans for the U.S. HEP Conductor Development Program", IEEE Trans. On Appl. Super., Vol. 13, No. 12, p. 1536, June 2002, the contents of which are incorporated herein by reference in their entirety. The $J_c$ (12 T, 4.2K) has been reported at or exceeding the 3,000 A/mm$^2$. See J. A. Parrell et al., "High Field $Nb_3Sn$ Conductor Development at Oxford Superconducting Technology", IEEE Trans. On Appl. Super., Vol. 13, No. 2, p. 3470, June 2003, the contents of which are incorporated herein by reference in their entirety. The non-Cu J achieved by the PIT approach is about 2,400 A/mm$^2$ at 12 T. See Lindenhovius, supra. These high $J_c$ performance characteristics are not possible with the bronze process due to lower tin availability.

Both the IT and PIT begin with a subelement. See Gregory, supra, and Godeke, supra. In the case of the IT, a Cu/Nb composite with solid niobium filaments imbedded in the copper matrix is hot extruded. After extrusion, the composite is gun drilled to form a hole at the center of the array of niobium filaments. A solid tin rod is then inserted into this composite and further processed to a size for restacking into a copper tube for design and fabrication of a multifilament conductor. The restacked billet is then cold drawn to final wire size.

In the case of the PIT approach, a copper-clad niobium tube is filled with an intermetallic $NbSn_2$ powder compound, plus additional free tin and copper powder. The PIT subelement is then processed to a final restack size and, like the IT approach, is assembled into another copper tube to fabricate the final multifilament wire.

A weakness of both of the IT and PIT $Nb_3Sn$ processes is the fact that both approaches have to rely on a restack and cold drawing of the sub-elements due to the low melting temperature of tin. Such cold processing introduces complications and adds cost to the overall manufacture of advanced multifilament conductors. The complications inherent by cold restacking of sub-elements include lack of adequate bonding between sub-elements leading to piece length issues and higher cost of manufacture.

The cost to fabricate the IT $Nb_3Sn$ superconductors is on the order of $2 to $4 per meter. The cost associated with the PIT process is currently greater than $4 per meter. In contrast, the cost of state-of-the-art NbTi superconductors manufactured for the MRI industry is on the order of $0.50 to $1.00 per meter. See L. D. Cooley, A. K. Ghosh, and R. M. Scanlan, "Costs of high field superconducting magnet strands", the contents of which are incorporated herein by reference in their entirety. If the cost of a $Nb_3Sn$ process could be reduced to the same level as the current state-of-the-art production levels of NbTi, then this higher performance conductor could become the conductor of choice for various commercial applications such as for example MR imaging and NMR spectroscopy. A low cost $Nb_3Sn$ conductor could allow magnet engineers new design opportunities toward reducing volume and weight of the overall magnet for a given applied magnetic field without sacrificing performance. Such a conductor would also have significant cost implications for large scale magnet projects such as upgrades for the Large Hadron Collider and the International Fusion machine. The fundamental issue is the nature of the low melting point of tin which inherently prevents the IT and the PIT multifilament processes to be hot extruded.

Earlier conductor developments have replaced the solid tin core of the sub-element in the IT process with salt cores. See W. Marancik, S. Hong, and R. Zhou, "Method for Producing Multifilamentary Niobium-Tin Superconductor", U.S. Pat. No. 5,534,219, Jul. 9, 1996, the contents of which are incorporated herein by reference in their entirety. The sub-elements with the salt cores are then assembled into a multifilament array as schematically depicted in FIG. 1. This assembly is then hot extruded. The result is a fully bonded multifilament composite with removable inert salt cores. The inert salt cores are then dissolved with jets of water leaving behind longitudinally extended channels which are symmetrically distributed with reference to the transverse cross-section of the conductor. These channels are then filled with solid tin followed by further drawing the composite to a final wire size.

In practice, the size of the salt cores need to be relatively large after extrusion in order to dissolve the salts with jets of water. However, in modern high critical current IT conductors (for example RRP process, see Parrell, supra), it is desirable to increase the number of sub-elements such that the subelement diameter is less than 100 microns at final wire diameter. This means the sub-elements with the salt cores would be too small for practical removal by water jet dissolution of the salts. Thus, the approach has been limited to a small number of sub-elements that may be designed into a multifilament billet.

Another recent IT development to reduce cost is the "Mono Element Internal Tin (MEIT) conductor. See B. A. Zeitlin, B. Gregory, J. Marte, M. Benz, T. Pyon, R. Scanlan, and D. Dietderich, "Results on Mono Element Internal Tin Nb3Sn Conductors (MEIT) with Nb7.5Ta and Nb(1Zr+0x) Filaments", IEEE Trans. on Appl. Supercond., Vol. 15. No. 2, pp. 3393, June 2005, the contents of which are incorporated herein by reference in their entirety. The approach in this process reduces the steps by eliminating the final restack assembly of 19 or 37 IT subelements as depicted in the schematic of FIG. 1. In this approach, the sub-element is hot extruded and drawn into a multifilament wire. This approach takes advantage of the cost effective large scale assembly of the subelement in a similar manner to MRI production size NbTi billets. However, a weakness of this approach is the fact that after extrusion, the composite must be gun-drilled to form a hole for the insertion of solid tin. This operation is expensive since very few companies worldwide specialize in this operation for superconducting composites. Moreover, gun-drilling a long length rod could result in an off center hole and damage the inner filaments. Furthermore, MRI extruded production scale rods are about 3 to 4 inches in diameter, 30 feet long and not perfectly straight. Technology to drill a straight hole over such a length does not exist. An example of MEIT conductor design is shown in FIG. 2. The central region is filled with solid tin after the extrusion and is surrounded by an array of solid niobium filaments in a copper matrix.

In the PIT process, $NbSn_2$ is the high tin source with about 72% tin by weight. While the melting point of $NbSn_2$ is about 850° C. and may be considered for hot extrusion, it is an extremely hard compound and difficult to fracture, making this approach expensive to fabricate. Drawing this wire with PIT sub-elements containing the hard $NbSn_2$ is difficult. The addition of ductile tin powder to micron size $NbSn_2$ powder in early as well as more recent advanced designs of PIT wires enables processing long piece lengths of wire. See H. Krauth, A. Szulczyk, M. Thoener, and J. Lindenhovius, "Some Remarks on the Development of Commercial NbTi and $Nb_3Sn$ Superconductors", in Progress on Nb-Based Superconductors, p. 91, Editors, K. Inoue, T. Takeuchi, and A. Kikuchi, Feb. 2-3, 2004, the contents of which are incorporated herein by reference in their entirety; C. V. Renaud, L. R. Motowidlo, and T. Wong, "Status of powder-in-tube $Nb_3Sn$ conductor development at Supercon", IEEE Trans. Appl. Supercond., Vol. 13, No. 2, pp. 3490-3493, 2003, the contents of which are incorporated herein by reference in their entirety; and L. R. Motowidlo and G. M. Ozeryansky, "A $Nb_3Sn$ Conductor via $Cu_5Sn_4$ PIT Process for High Field Applications", Adv. In Cryo. Eng., Vol. 54, p. 269, Jul. 16-20, 2007, the contents of which are incorporated herein by reference in their entirety. See also Matt Jewell et al., "Novel Approaches to Forming $Nb_3Sn$", 2005 Low Temperature Workshop, Napa, Calif., the contents of which are incorporated herein by reference in their entirety. Low temperature hydrostatic extrusion of PIT composite wires is presently being explored by groups in Europe to develop a large-scale process. However, reports so far indicate some difficulties with wire drawing. This may be due to the hard nature of $NbSn_2$ and/or the lack of true bonding from low temperature hydrostatic extrusion. Moreover, it is still an expensive process due to the inherent high cost of the micron size Nb powder and the high cost of processing to form the intermetallic micron size $NbSn_2$ powder. Furthermore, large scale hydrostatic presses are few worldwide with limited access for extrusion.

Referring to FIGS. 3a and 3b, in general, PIT $Nb_3Sn$ wire utilizing $NbSn_2$ or $Cu_5Sn_4$ has shown a porous remnant of the core after final reaction and diffusion of the tin into the niobium tube. Another general feature of PIT $Nb_3Sn$ wires is large Al5 grains on the inner diameter of the reacted layer. Both features are undesirable. These general features have also been observed in recent PIT development work with $FeSn_2$, $Ni_3Sn_4$, and $YSn_2$ high-tin compounds. See L. R. Motowidlo, "An Extrudable Low-Cost $Nb_3Sn$ PIT Conductor for Applications for Applications to HEP Magnets", Phase II SBIR ER84482, the contents of which are incorporated herein by reference in their entirety. FIGS. 3a and 3b illustrates a porosity and a large grain size of PIT $Nb_3Sn$ wire utilizing $Cu_5Sn_4$ cores.

SUMMARY OF THE INVENTION

In one aspect, the invention provides a method of manufacturing $Nb_3Sn$ or $V_3Ga$ superconductor wire. The method comprises the steps of: preparing an intermetallic powder compound; producing a plurality of copper-clad rods comprising one of niobium, vanadium, a niobium alloy, and a vanadium alloy; inserting the intermetallic powder compound into a tube comprising copper; inserting the tube into a central portion of a can comprising copper; arranging the plurality of copper-clad rods in a configuration surrounding the tube; inserting a diffusion barrier between an outer portion of the arranged plurality of rods and an inner portion of the can; welding a nose and a lid to the can under a vacuum to produce a multi-element assembly; hot extruding the multi-element assembly to produce at least one rod containing $Nb_3Sn$ or $V_3Ga$; and forming a wire having a predetermined diameter by drawing the at least one rod containing $Nb_3Sn$ or $V_3Ga$.

The step of arranging may further include the step of arranging the plurality of copper-clad rods in an octagonal configuration surrounding the tube. Alternatively, the step of arranging may further include the step of arranging the plurality of copper-clad rods in a hexagonal configuration surrounding the tube.

The intermetallic powder compound may be selected from the group consisting of $MnSn_2$, $Mn_2Sn$, $Ni_3Sn_4$, TiSn, and CuGa. When the plurality of copper-clad rods comprises a niobium alloy, the niobium alloy may be selected from the group consisting of Nb-x % Ti, Nb-x % Ta, Nb-x % Gd, Nb-x % Y, Nb-x % Nd, Nb7.5% Ta-x % Gd, Nb7.5% Ta-x % Y, and Nb7.5% Ta-x % Nd. When the plurality of copper-clad rods comprises a vanadium alloy, the vanadium alloy may be selected from the group consisting of V-x % Y, V-x % Gd, and V-x % Nd. Each of the plurality of copper-clad rods may have a diameter that is greater than or equal to 1.4 mm and less than or equal to 15 mm, and a length that is greater than or equal to 300 mm and less than or equal to 6000 mm.

The can comprising copper may be made using 101 oxygen-free copper. The tube comprising copper may be made using one of 101 oxygen-free copper and GLIDCOP Al-15 dispersion strengthened copper. The diffusion barrier may include at least one of niobium and tantalum. The diffusion barrier may have a thickness that is greater than or equal to 0.6 mm and less than or equal to 1.2 mm.

The step of hot extruding may further include the steps of pre-heating the multi-element assembly at a temperature approximately equal to 500° C. for approximately one hour and extruding the multi-element assembly with an extrusion ratio of approximately 16 to 1. The predetermined diameter of the formed wire may be greater than or equal to 0.5 mm and less than or equal to 3.0 mm.

In another aspect, the invention provides a method of manufacturing $Nb_3Sn$ or $V_3Ga$ superconductor wire. The method comprises the steps of: preparing an intermetallic powder compound; producing a plurality of copper-clad rods comprising one of niobium, vanadium, a niobium alloy, and a vanadium alloy; inserting the intermetallic powder compound into a tube comprising copper; inserting the tube into a central portion of a can comprising copper; arranging the plurality of copper-clad rods in a configuration surrounding the tube; inserting a diffusion barrier between an outer portion of the arranged plurality of rods and an inner portion of the can; welding a nose and a lid to the can under a vacuum to produce a multi-element assembly; cold-drawing the multi-element assembly to a first predetermined diameter to produce at least one rod containing $Nb_3Sn$ or $V_3Ga$; and forming a wire having a second predetermined diameter by drawing the at least one rod containing $Nb_3Sn$ or $V_3Ga$.

The step of arranging may further comprise the step of arranging the plurality of copper-clad rods in an octagonal configuration surrounding the tube. Alternatively, the step of arranging may further comprise the step of arranging the plurality of copper-clad rods in a hexagonal configuration surrounding the tube. The intermetallic powder compound may be selected from the group consisting of $MnSn_2$, $Mn_2Sn$, $Ni_3Sn_4$, TiSn, and CuGa. When the plurality of copper-clad rods comprises a niobium alloy, the niobium alloy may be selected from the group consisting of Nb-x % Ti, Nb-x % Ta, Nb-x % Gd, Nb-x % Y, Nb-x % Nd, Nb7.5% Ta-x % Gd, Nb7.5% Ta-x % Y, and Nb7.5% Ta-x % Nd. When the plurality of copper-clad rods comprises a vanadium alloy, the niobium alloy may be selected from the group consisting of V-x % Y, V-x % Gd, and V-x % Nd.

DETAILED DESCRIPTION OF THE INVENTION

Figure 1:
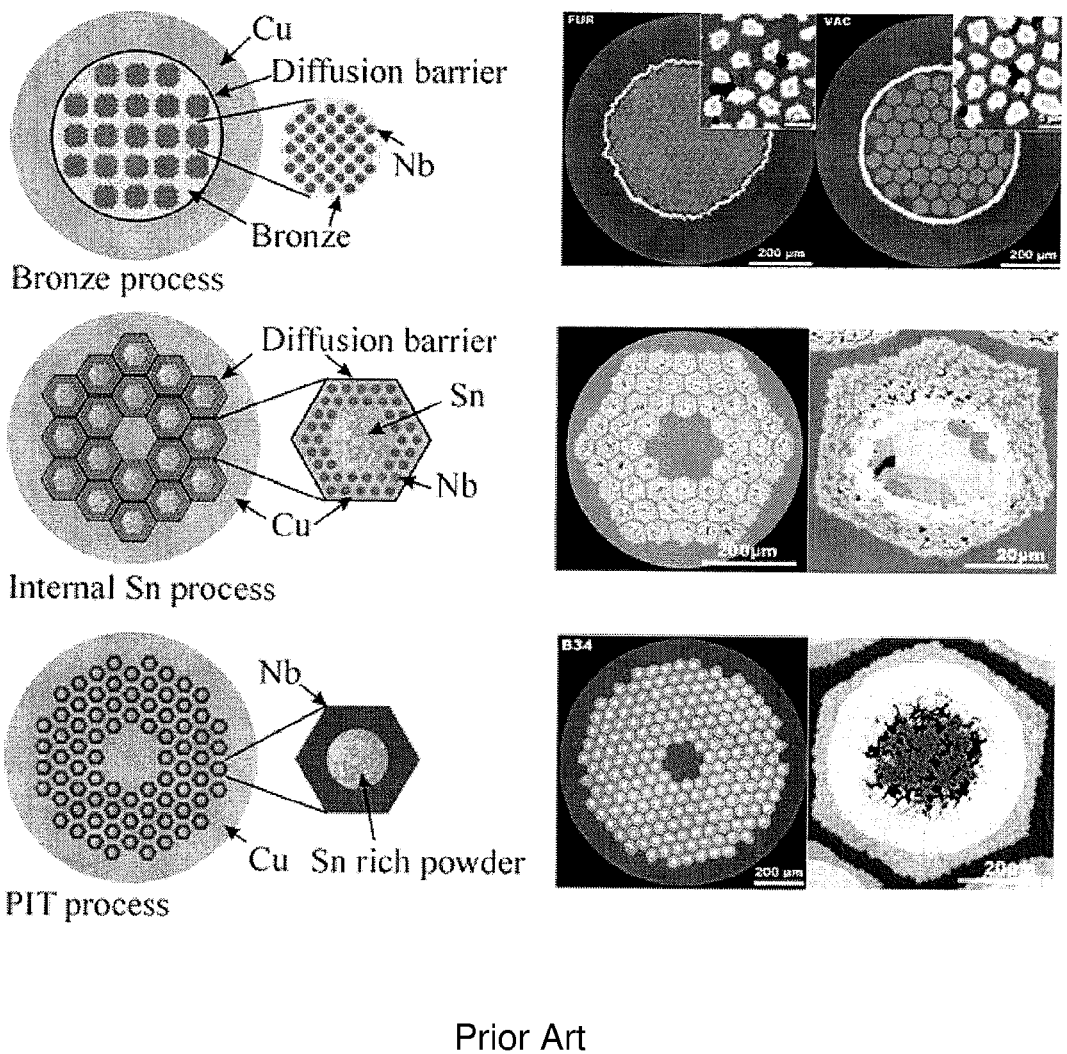
FIG. 1 illustrates schematics of several conventional $Nb_3Sn$ manufacturing process designs.
Figure 2:
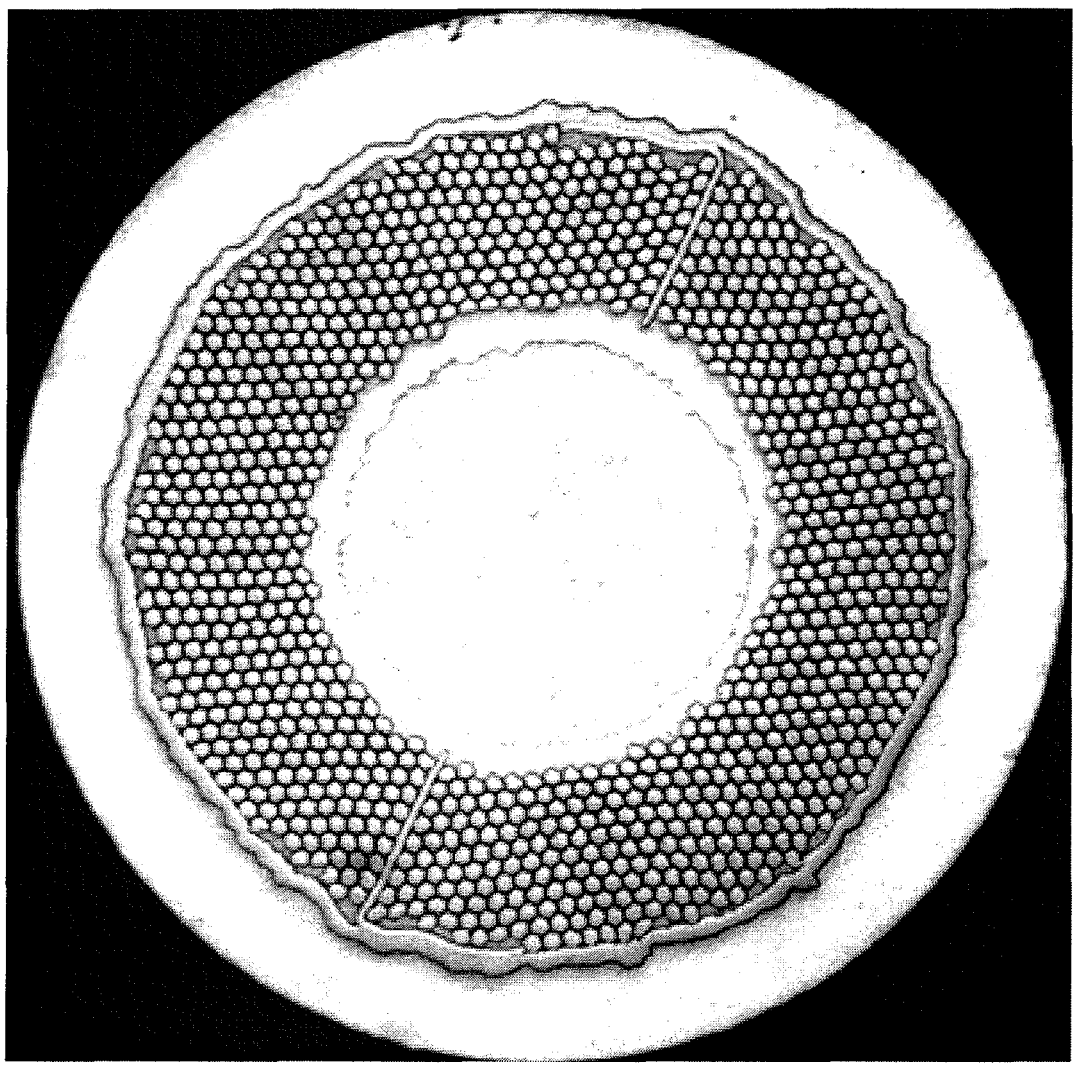
FIG. 2 shows an exemplary Mono Element Internal Tin (MEIT) conductor design.
Figure 3A:
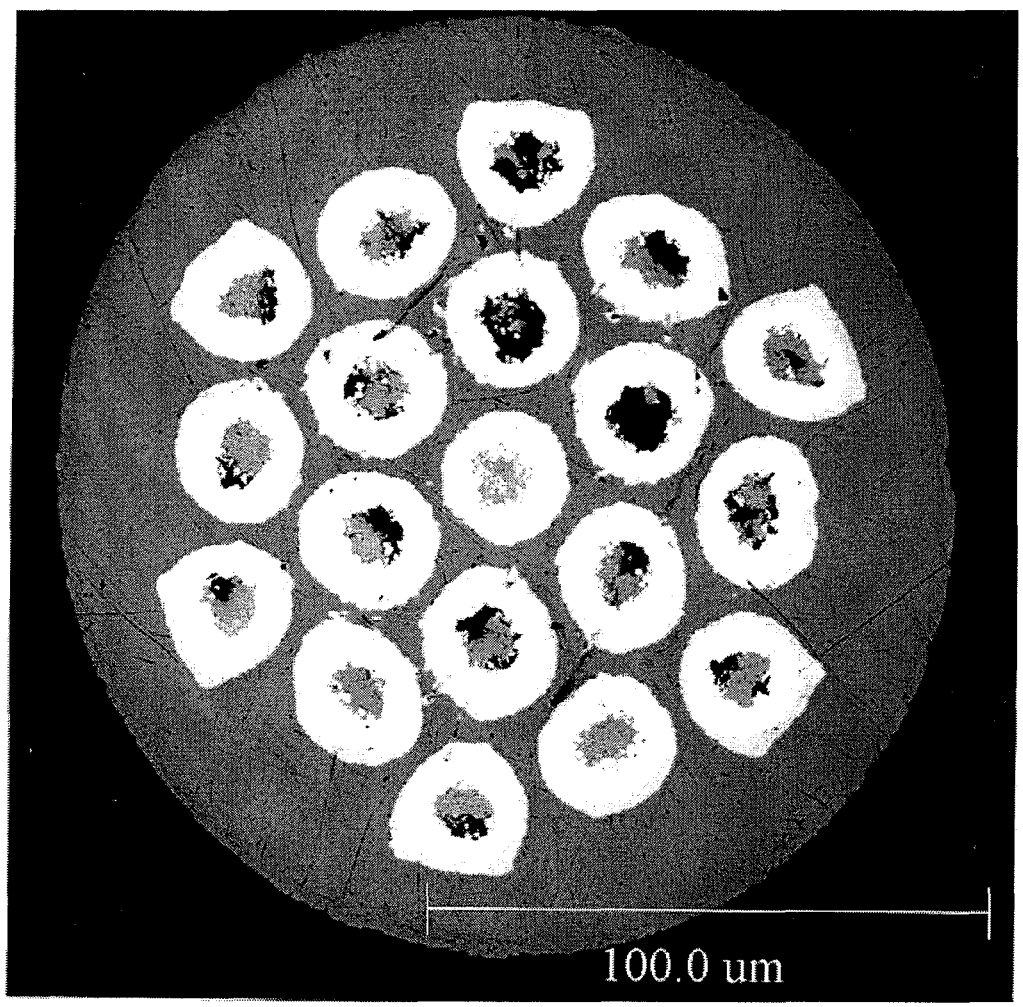
FIGS. 3a and 3b illustrates a porosity and a large grain size of PIT $Nb_3Sn$ wire utilizing $Cu_5Sn_4$ cores.
Figure 3B:
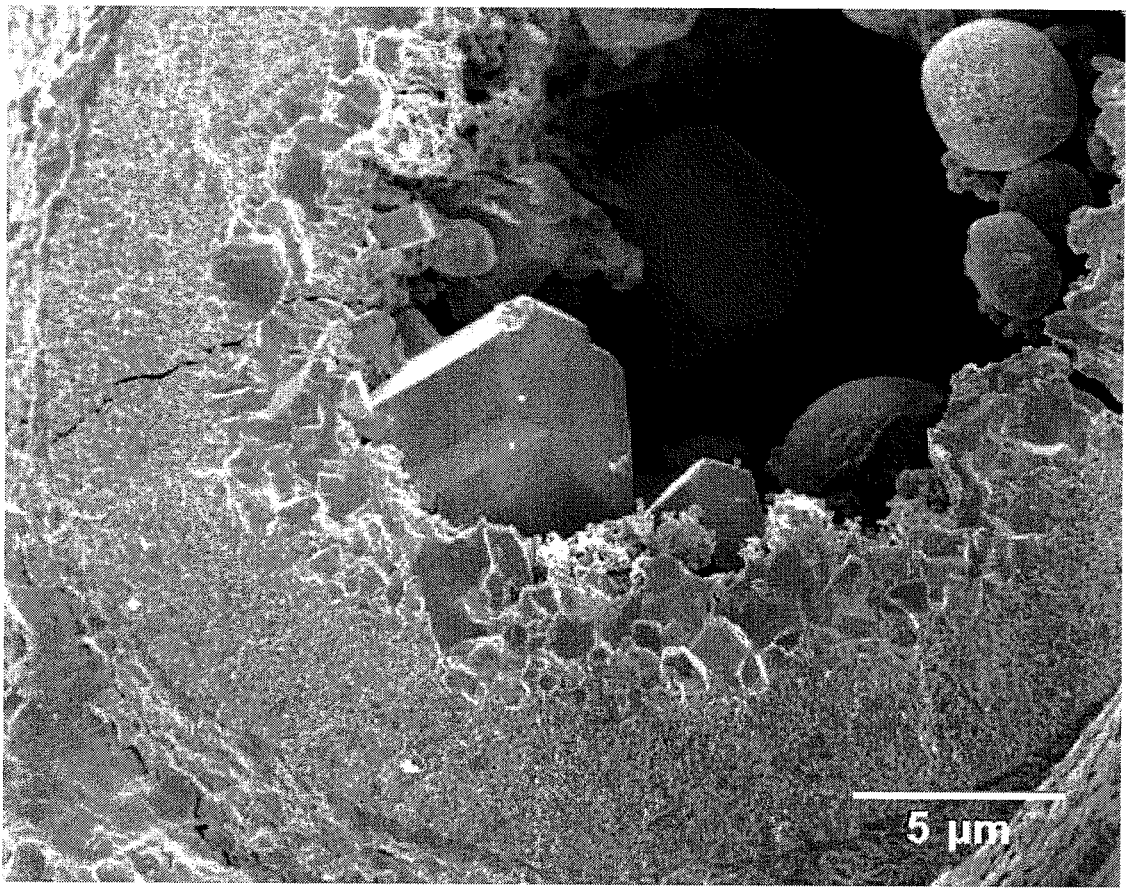
Figure 4:
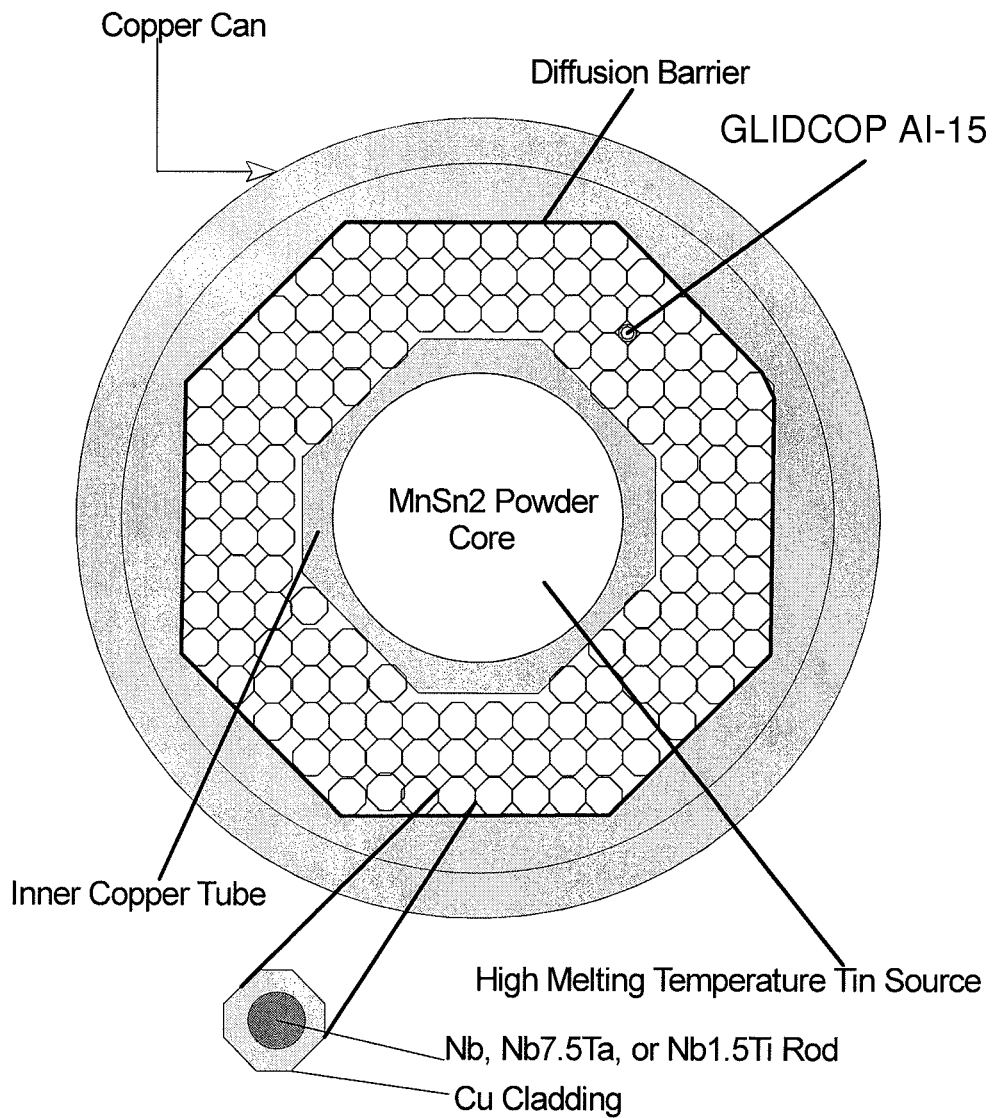
FIG. 4 shows a schematic diagram of a first multifilament $Nb_3Sn$ design that is produced by using a powder and rod process according to a preferred embodiment of the present invention.
Figure 4A:
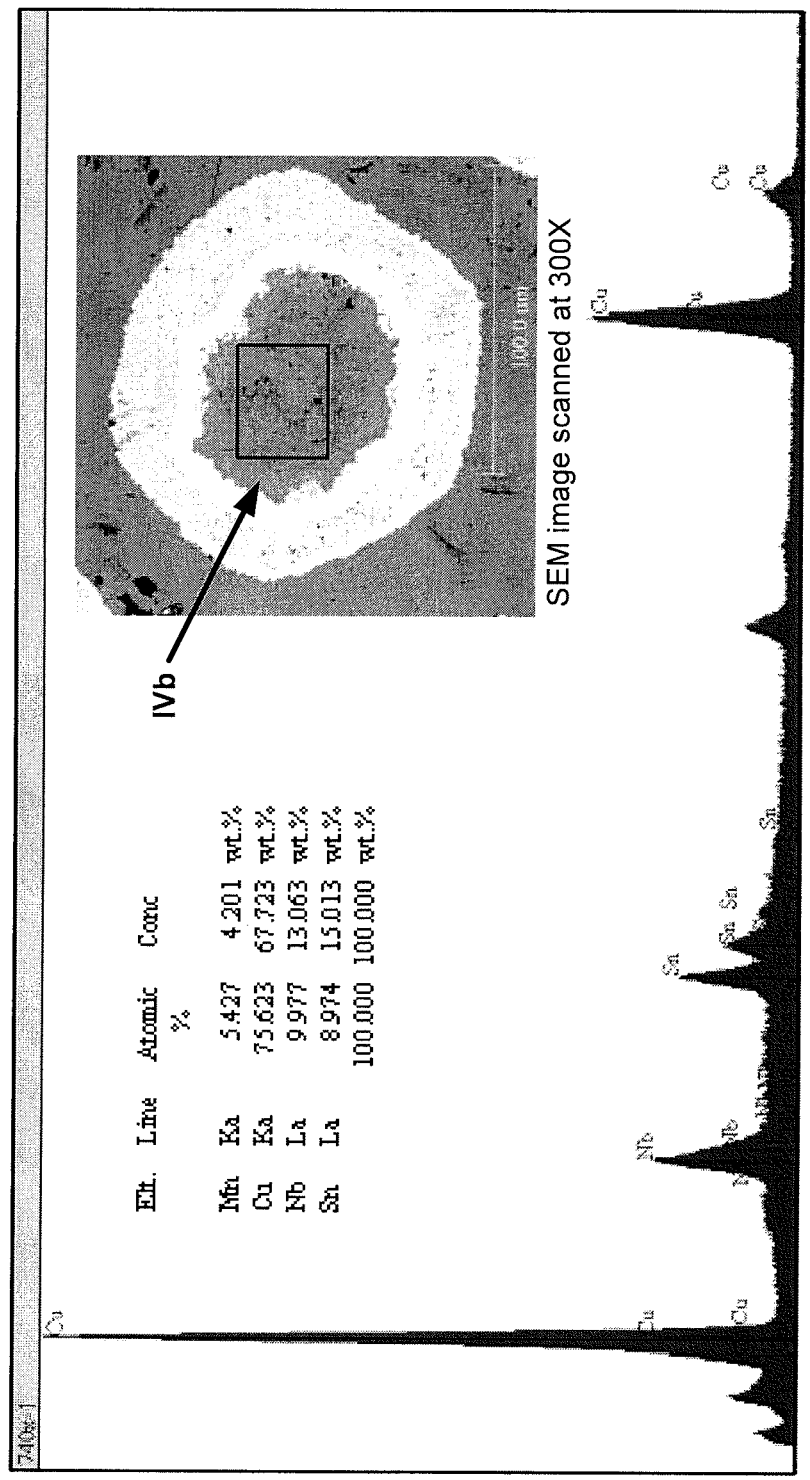
FIG. 4a shows an analysis of and an illustration of a solid core within the PIT sub-elements after completing a heat treatment reaction as part of a method of manufacturing $Nb_3Sn$ superconductor wire using a PIT process according to a preferred embodiment of the present invention.
Figure 4B:
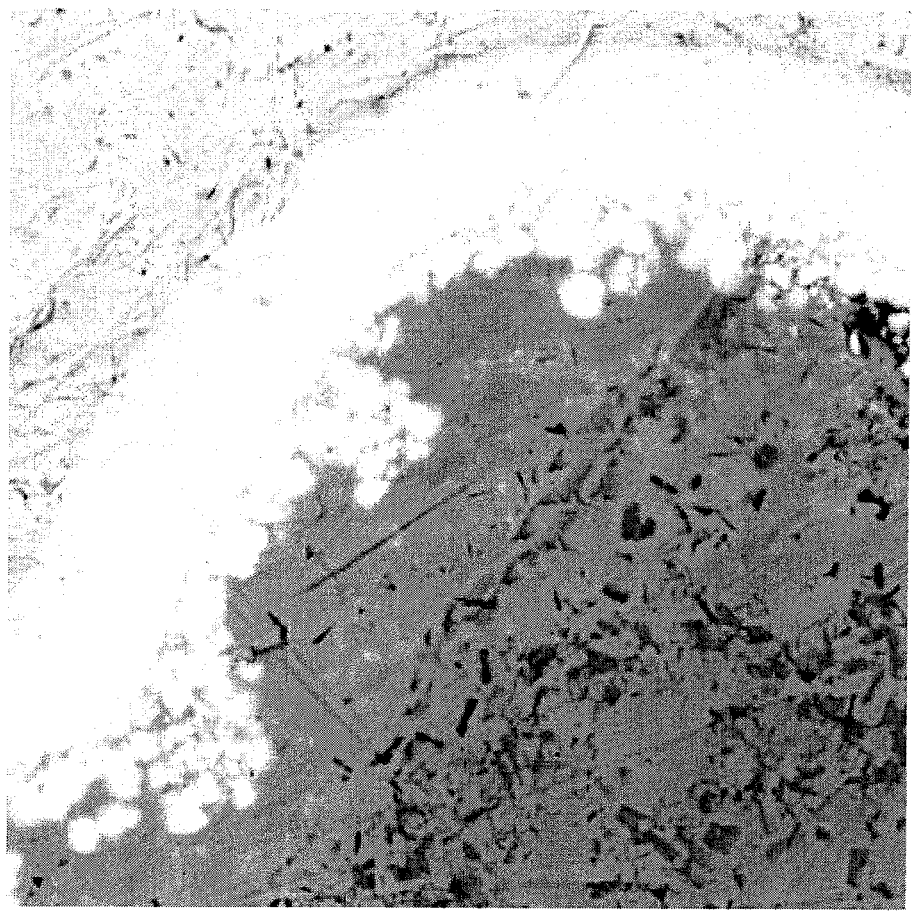
FIG. 4b illustrates a PIT core interface with a reaction layer as observed while performing a method of manufacturing $Nb_3Sn$ superconductor wire using a PIT process according to a preferred embodiment of the present invention.
Figure 5:
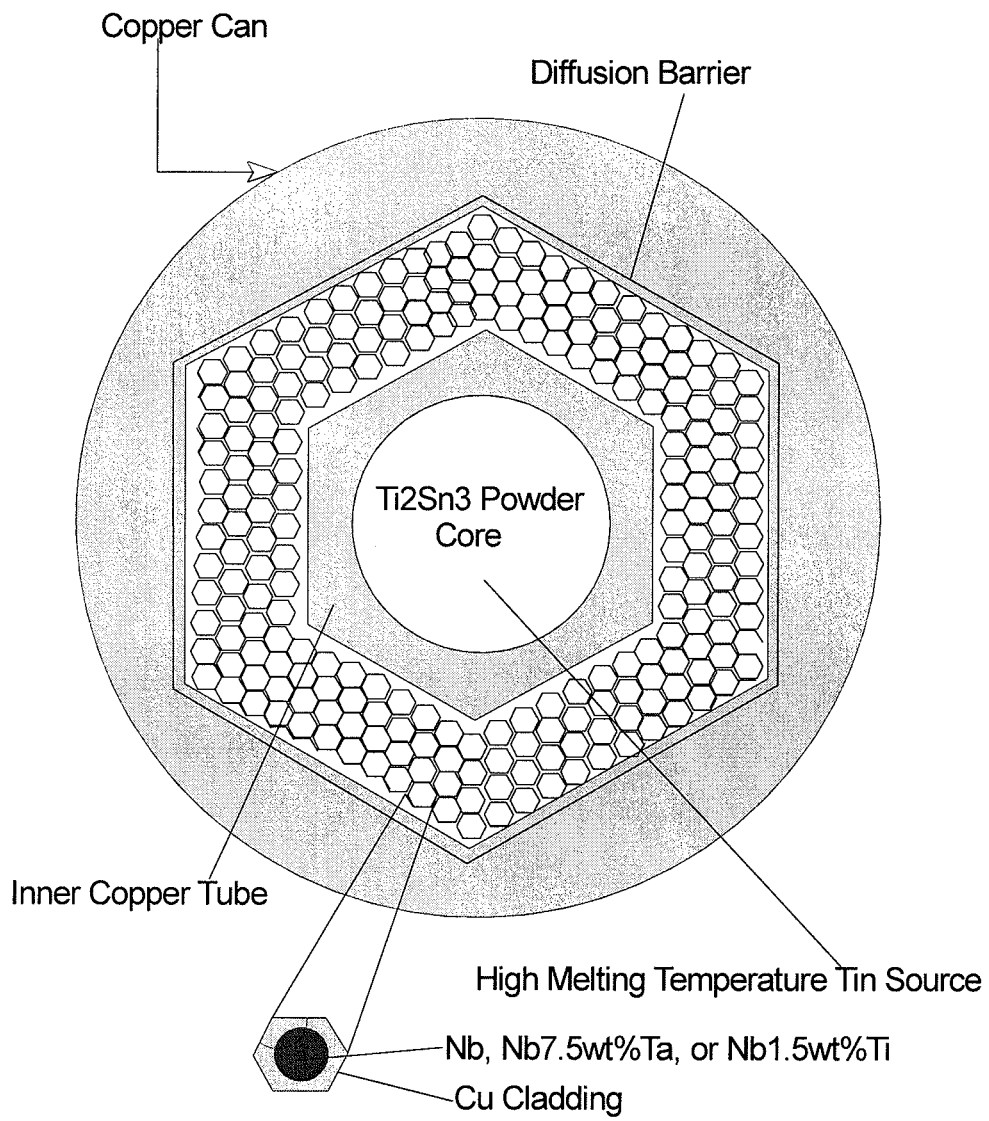
FIG. 5 shows a schematic diagram of a second multifilament $Nb_3Sn$ design that is produced by using a powder and rod process according to a preferred embodiment of the present invention.
Figure 6:
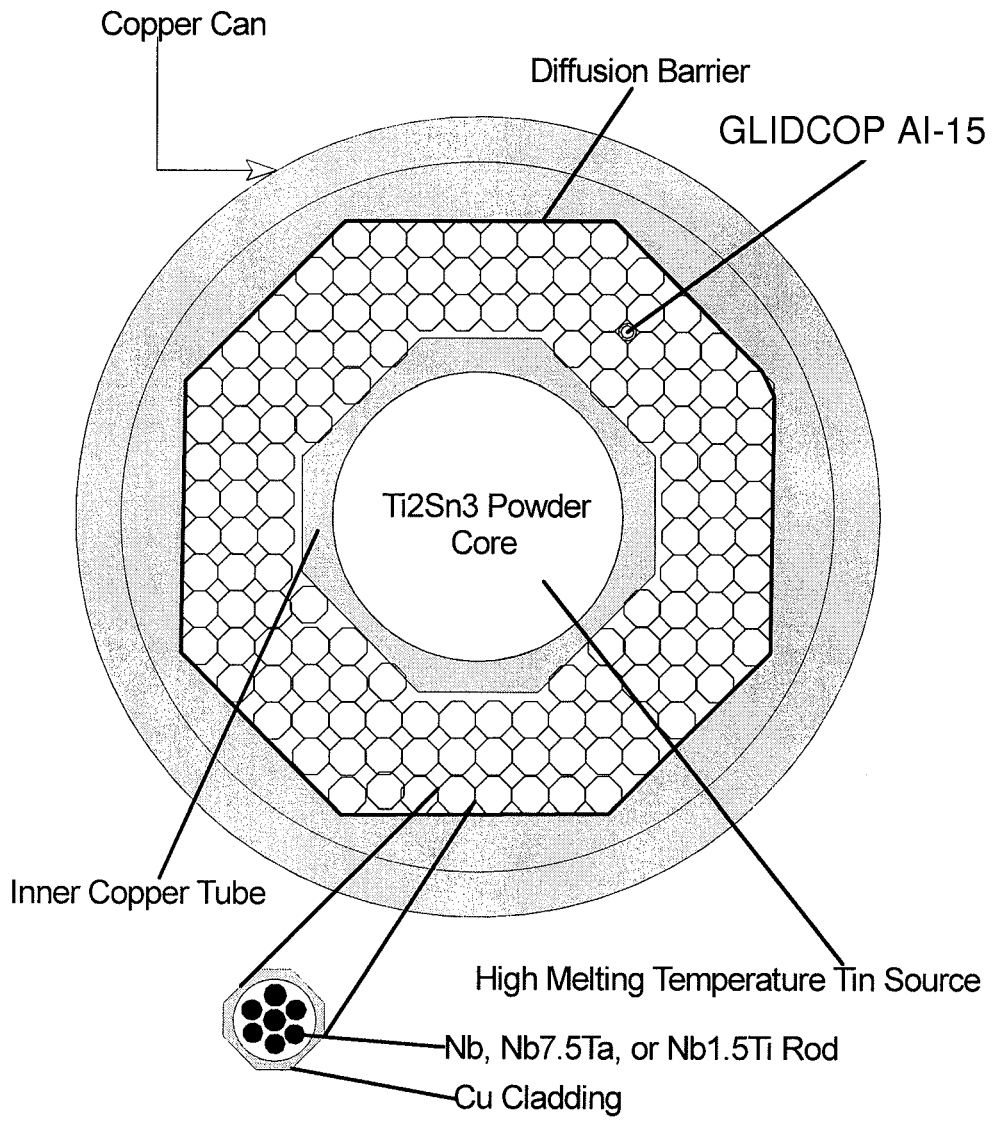
FIG. 6 shows a schematic diagram of a third multifilament $Nb_3Sn$ design that is produced by using a powder and rod process according to a preferred embodiment of the present invention.

It is an object of this invention to introduce a multifilament $Nb_3Sn$ design that incorporates a plurality of Nb, Nb-x % Ti, Nb-x % Ta, Nb-x % Gd, Nb-x % Y, Nb-x % Nd, Nb7.5% Ta-x % Gd, Nb7.5% Ta-x % Y, or Nb7.5% Ta-x % Nd filaments in a copper matrix. It is another object of this invention to introduce a multifilament $V_3Ga$ design that incorporates a plurality of V, V-x % Y, V-x % Gd, or Vx % Nd filaments in a copper matrix. At the center of the array of filaments, a central core is filled with a low-cost intermetallic powder compound. From the binary phase diagrams, a number of intermetallic compounds with tin may be identified as possible candidates that have high melting temperatures and high tin content. Referring to FIGS. 4, 5, and 6, three exemplary embodiments of the present invention are illustrated as schematic diagrams of the powder and rod process (PRP). The PRP approach allows hot extrusion or cold extrusion and processing of a large-scale $Nb_3Sn$ multifilament billet or a large scale $V_3Ga$ multifilament billet.

Referring to FIG. 4, a first example shows a design with an octagonal array of Nb filaments with high strength GLIDCOP Al-15 elements. Referring to FIG. 5, a second example shows a conventional hexagonal array of Nb filaments with a MnSn2 central core as the tin source. Referring to FIG. 6, a third example shows a design with octagonal sub-elements containing more than one filament.

Another object of the present invention is to utilize a high melting point intermetallic powder compound. This intermetallic compound is then introduced into the central hole, as schematically depicted in FIGS. 4, 5, and 6. Examples of preferred intermetallic powder compounds are $MnSn_2$, $Mn_2Sn$, $Ni_3Sn_4$, TiSn, and CuGa. In a preferred embodiment, the high-tin powder compounds are used in conjunction with niobium or niobium-alloy filament rods, and copper-gallium powder is used in conjunction with vanadium or vanadium-alloy filament rods. In a preferred embodiment, when copper-gallium powder is used, the copper-gallium powder contains between 20% gallium and 60% gallium by weight. After extrusion or cold drawing to wire, the high-tin intermetallic compound acts as the high tin source for reacting the Nb, Nb-x % Ti, Nb-x % Ta, Nb-x % Gd, Nb-x % Y, Nb-x % Nd, Nb7.5% Ta-x % Gd, Nb7.5% Ta-x % Y, or Nb7.5% Ta-x/oNd filaments within the surrounding matrix to form the $Nb_3Sn$ superconductor, or the copper-gallium powder acts as a gallium source for the V, V-x % Y, V-x % Gd, or V-x % Nd filaments within the surrounding matrix to form the $V_3Ga$ superconductor.

Method of Manufacture

Preparation of the Intermetallic Powder Compound

Figure 7:
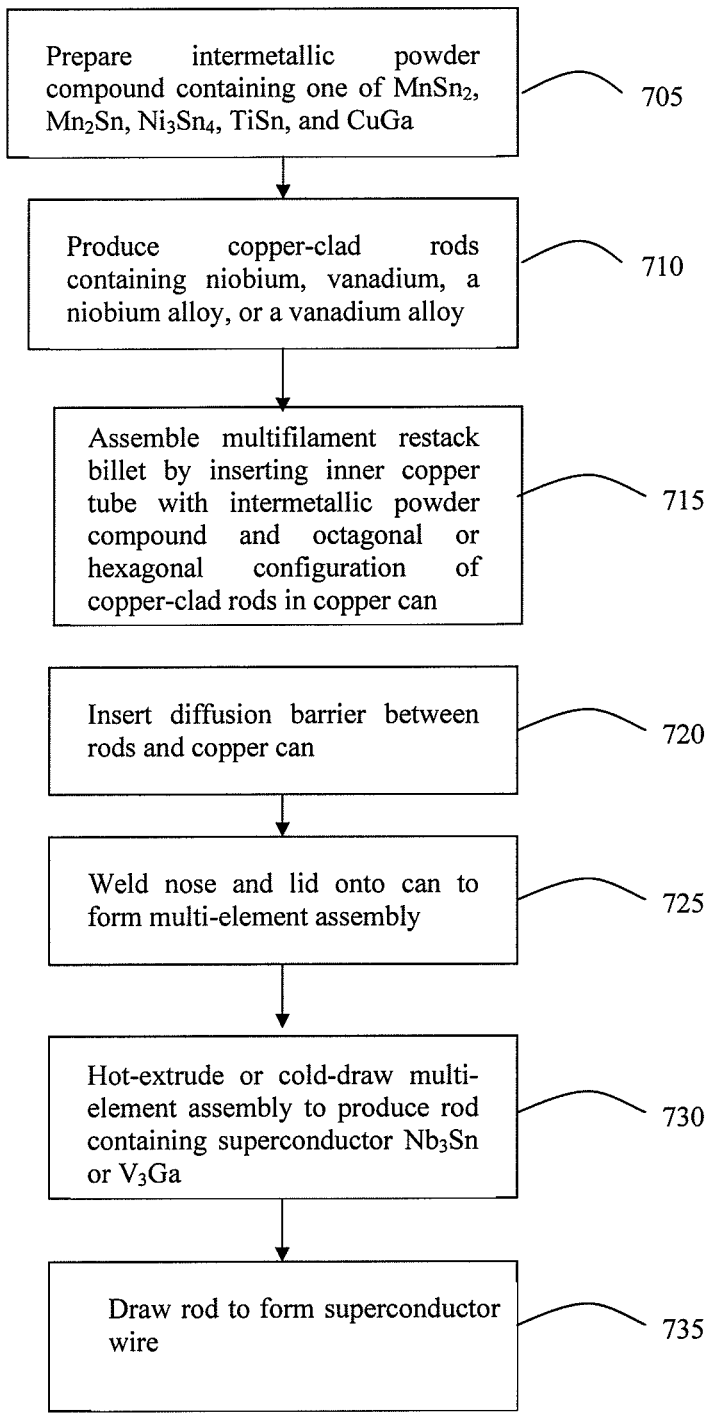
FIG. 7 shows a flow chart that illustrates a powder and rod process for manufacturing $Nb_3Sn$ or $V_3Ga$ superconductor wire using an intermetallic powder compound and an octagonal or hexagonal arrangement of copper clad rods containing niobium, vanadium, a niobium alloy, or a vanadium alloy, according to a preferred embodiment of the present invention.

Referring to FIG. 7, an exemplary process 700 for manufacturing a superconductor wire according to a preferred embodiment of the present invention is illustrated. In the first step 705, an intermetallic powder compound is prepared. In one exemplary experiment of a powder and rod process according to a preferred embodiment of the present invention, as an example of an intermetallic candidate for the powder and rod process, $MnSn_2$ powder was chosen. Elemental manganese and tin having up to 44 micron particle size was weighted to include 81% tin by weight and 19% manganese by weight, then mixed in a SPEX 8000 mixer/mill or production size shaker under an argon atmosphere. Depending on the billet size, an appropriate amount of phase pure $MnSn_2$ was prepared. In the case of $MnSn_2$, it was found that a heat treatment condition of 500° C. for 72 hours was appropriate. Variation from this temperature and time may be applied to produce nearly phase pure material. Once the compound has been produced, mechanical grinding by a mortar and pestle produces less than 150 micron particle size. Further processing may be performed by jet milling the $MnSn_2$ compound to less than 5 microns, but is not necessary. A cost benefit of the powder and rod process is that the intermetallic powder, such as $MnSn_2$, is not constrained to the sub-element final diameter as in the PIT process, but to the wire final diameter. In the powder and rod process according to a preferred embodiment of the present invention, the final intermetallic high-tin powder may have a top size on the order of 100 microns, thereby reducing the amount of process work. Particles sizes above this may be possible, but depend on the final wire diameter and size of the inner hole.

Another cost benefit of the PRP process according to a preferred embodiment of the present invention is that copper is already an integral part of the conductor design and does not need to be added separately, as currently performed in the conventional PIT process. In order to promote the reaction of tin with the niobium or niobium-alloy rods, copper must be included. Copper is a necessary catalyst to form $Nb_3Sn$.

Preparation of the Copper Clad Niobium, Vanadium Niobium Alloy or Vanadium Alloy Elements As illustrated in FIGS. 4, 5, and 6, in the PRP process according to a preferred embodiment of the present invention, solid niobium, vanadium, niobium alloy, or vanadium alloy rods are arranged in a hexagonal or octagonal configuration. The second step 710 of the process 700 in preparation of the multifilament billet assembly is the fabrication of the copper clad rods. First, a Nb, Nb-x % Ti, Nb-x % Ta, Nb-x % Gd, Nb-x % Y, Nb-x % Nd, Nb7.5% Ta-x % Gd, Nb7.5% Ta-x % Y, Nb7.5% Ta-x % Nd, V, Vx % Y, V-x % Gd, or V-x % Nd bar having a diameter in the range of 100 mm to 200 mm and having a length in the range of 300 mm to 900 mm is carefully cleaned, decreased and inserted into a copper can. The can is welded under a vacuum, and the mono-element assembly is then hot extruded. Typical industry standard extrusion parameters include ratios of 16 to 1 reduction and extrusion temperatures on the order of 600° C. After extrusion, the copper clad mono-element rod is further drawn to a size determined by the design of the conductor. The design is determined by the number of desired superconducting filaments and filament diameter in the final conductor diameter. Near final size, the copper to mono-element rod area ratio may be adjusted by mechanical grinding to achieve the desired filament spacing. The final drawing step will include shaping of the copper clad mono-element through a hexagonal or octagonal die. The final diameter over the copper clad mono-elements can range from 1.4 mm to 15 mm, and the final length can range from 300 mm to 6000 mm, depending on the design of the restack billets as schematically shown in FIGS. 4, 5, and 6.

Preparation of the Copper Restack Can, Nose, Lid, and Inner Copper Tube

In the third step 715, the multifilament restack billet is assembled. The copper can for the multifilament restack assembly is typically machined from 101 oxygen free copper. The nose and lid are also machined. The outer diameter and inner diameter of the restack can be 100 mm (outer diameter) by 60 mm (inner diameter) for cold restack multifilament billets, and as large as 300 mm (outer diameter) by 250 mm (inner diameter) for hot extrusion multifilament billets such as production MRI type billets. The inner copper tube can be made from 101 oxygen free copper or GLIDCOP Al-15 dispersion strengthened copper. The diameter is machined to a hexagonal or octagonal shape with a round inner diameter for both configurations, as shown in FIGS. 4, 5, and 6. After filling, copper threaded caps for the inner tube are machined to contain the intermetallic powder. The inner area of the tube is typically 25% of the area under the diffusion barrier. All copper parts after machining and preparation are etched, rinsed in alcohol, and dried.

Assembly of the Multifilament Restack Billet

The number of copper-clad niobium, vanadium, niobium-alloy, or vanadium-alloy elements in the restack billet may vary, depending on the application. For example, for magnetic resonance imaging (MRI) magnets, superconductors with as little as several tens of filaments to a few hundred filaments may be required depending on the specific application. For nuclear magnetic resonance (NMR) spectrometers, the number of filaments on the order of a few hundred to several hundred may be required, depending on the specific application. For large devices such as accelerator or fusion type machines, the number of filaments may be on the order of thousands.

The restack assembly portion of the PRP process, according to a preferred embodiment of the present invention, starts with introducing the MnSn2 powder into the inner copper tube. One end of the tube is closed by a cap that is threaded onto the end. The MnSn2 powder is then poured into the tube to tap density. The packing density is about 4 g/cc to 5 g/cc. After filling, the end is closed with another threaded cap. The powder core assembly is then introduced into the center of the outer copper can. This is achieved by a recessed hexagonal or octagonal step symmetrically centered in the bottom lid for the restack assembly. The copper-clad niobium or niobium alloy elements are then stacked into a hexagonal (i.e., as shown in FIG. 5) or octagonal (i.e., as shown in FIGS. 4 and 6) configuration, according to the required number of elements for the application. In the case of the octagonal assembly, GLIDCOP Al-15 filler rods are inserted into the voids between the elements. The GLIDCOP Al-15 is a dispersion strengthened copper which increases the overall mechanical strength of the final wire.

In the fourth step 720, a diffusion barrier, typically niobium and/or tantalum, is inserted between the elements and the outer copper. The thickness may vary from 0.6 mm to 1.2 mm. A single wrap with a slight overlap is preferred. In the event that both niobium and tantalum are used, then a double wrap will be performed.

In the fifth step 725, after the assembly is complete, the copper nose is applied. The copper nose is machined such that the inner powder core filled tube may be recessed into the nose upon closing. The billet is then placed into a high vacuum and the nose and lid are electron beam welded to the copper can.

Processing of the Powder and Rod Approach

In the sixth step 730, once the billet is assembled, the billet is hot isostatic pressed (HIPP) to consolidate and remove any voids between the elements. This is typically performed at about 500° C. to 600° C. for 1 to 2 hours. After HIPPing, in a preferred embodiment, the billet is hot extruded; alternatively, the billet may be drawn at room temperature. In a preferred embodiment, the extrusion pre-heat temperature is about 500° C. for one hour. At temperature, the billet is extruded with an extrusion ratio of 16 to 1. Finally, in the seventh step 735, once extruded or drawn, the rod is further processed by drawing through standard industry reduction schedules to the final wire diameter. Depending on the application, the final outer diameter may vary from 0.5 mm to 3.0 mm.

In an alternative embodiment, a powder and rod process may include assembly into a copper tube with an outer diameter of up to about 100 mm. This multifilament billet is then cold drawn to a desired final wire diameter without hot extruding.

At final size, the wire is ready for insulation and coil winding. After the coil is wound, then a heat treatment protocol is applied which may be at temperatures of 625° C. to 750° C. for 50 to 300 hours. The temperature and duration depend on the coil size and the reaction kinetics of the $Nb_3Sn$ or $V_3Ga$. For small magnet devices such as lab magnets or NMR grade magnets, wind and react is the preferred way. For large scale applications such as MRI, it may be desirable for practical fabrication to react and wind the magnet. In a preferred embodiment of the present invention, the design configuration utilizing octagons and GLIDCOP Al-15 may allow the react and wind approach. In this case, the wire has better strain characteristics as compared to conventional hexagonal conductor architectures.

While the present invention has been described with respect to what is presently considered to be the preferred embodiment, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing $Nb_3Sn$ or $V_3Ga$ superconductor wire, the method comprising the steps of:
   providing Sn or Ga;
   preparing an intermetallic powder compound comprising Sn or Ga;
   producing a plurality of copper-clad rods comprising one of niobium, vanadium, a niobium alloy, and a vanadium alloy;
   inserting the intermetallic powder compound into a tube comprising copper;
   inserting the tube into a central portion of a can comprising copper;
   arranging the plurality of copper-clad rods in a configuration surrounding the tube;
   inserting a diffusion barrier between an outer portion of the arranged plurality of rods and an inner portion of the can;
   welding a nose and a lid to the can under a vacuum to produce a multi-element assembly;
   cold-drawing the multi-element assembly to a first predetermined diameter to produce at least one rod containing $Nb_3Sn$ or $V_3Ga$; and
   forming a wire having a second predetermined diameter by drawing the at least one rod containing $Nb_3Sn$ or $V_3Ga$.

2. The method of claim 1, wherein each of the plurality of copper-clad rods has a diameter that is greater than or equal to 1.4 mm and less than or equal to 15 mm, and a length that is greater than or equal to 300 mm and less than or equal to 6000 mm.

3. The method of claim 1, wherein the can comprising copper is made using 101 oxygen-free copper.

4. The method of claim 1, wherein the tube comprising copper is made using one of 101 oxygen-free copper and GLIDCOP Al-15 dispersion strengthened copper.

5. The method of claim 1, wherein the diffusion barrier comprises at least one of niobium and tantalum.

6. The method of claim 1, wherein the diffusion barrier has a thickness that is greater than or equal to 0.6 mm and less than or equal to 1.2 mm.

7. The method of claim 1, wherein the predetermined diameter of the formed wire is greater than or equal to 0.5 mm and less than or equal to 3.0 mm.

8. The method of claim 1, wherein the step of arranging further comprises the step of arranging the plurality of copper-clad rods in an octagonal configuration surrounding the tube.

9. The method of claim 1, wherein the step of arranging further comprises the step of arranging the plurality of copper-clad rods in a hexagonal configuration surrounding the tube.

10. The method of claim 1, wherein the intermetallic powder compound is selected from the group consisting of $MnSn_2$, $Mn_2Sn$, $Ni_3Sn_4$, TiSn, and CuGa.

11. The method of claim 1, wherein when the plurality of copper-clad rods comprises a niobium alloy, the niobium alloy is selected from the group consisting of Nb-x % Ti, Nb-x % Ta, Nb-x % Gd, Nb-x % Y, Nb-x % Nd, Nb7.5% Ta-x % Gd, Nb7.5% Ta-x % Y, and Nb7.5% Ta-x % Nd.

12. The method of claim 1, wherein when the plurality of copper-clad rods comprises a vanadium alloy, the vanadium alloy is selected from the group consisting of V-x % Y, V-x % Gd, and V-x % Nd.

13. A method of manufacturing $Nb_3Sn$ or $V_3Ga$ superconductor wire, the method comprising the steps of:
   providing Sn or Ga;
   preparing an intermetallic powder compound comprising Sn or Ga;
   producing a plurality of copper-clad rods comprising one of niobium, vanadium, a niobium alloy, and a vanadium alloy;
   inserting the intermetallic powder compound into a tube comprising copper;
   inserting the tube into a central portion of a can comprising copper;
   arranging the plurality of copper-clad rods in a configuration surrounding the tube;
   inserting a diffusion barrier between an outer portion of the arranged plurality of rods and an inner portion of the can;
   welding a nose and a lid to the can under a vacuum to produce a multi-element assembly;
   hot extruding the multi-element assembly to produce at least one rod containing $Nb_3Sn$ or $V_3Ga$; and
   forming a wire having a predetermined diameter by drawing the at least one rod containing $Nb_3Sn$ or $V_3Ga$.

14. The method of claim 13, wherein the step of hot extruding further comprises the steps of pre-heating the multi-element assembly at a temperature approximately equal to 500° C. for approximately one hour and extruding the multi-element assembly with an extrusion ratio of approximately 16 to 1.

* * * * *